United States Patent
Phoa et al.

(10) Patent No.: US 11,737,362 B2
(45) Date of Patent: Aug. 22, 2023

(54) HARVESTING ENERGY IN AN INTEGRATED CIRCUIT USING THE SEEBECK EFFECT

(71) Applicant: Intel Corporation, Santa Clara, CA (US)

(72) Inventors: Kinyip Phoa, Beaverton, OR (US); Jui-Yen Lin, Hillsboro, OR (US); Nidhi Nidhi, Hillsboro, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 319 days.

(21) Appl. No.: 16/074,151

(22) PCT Filed: Apr. 1, 2016

(86) PCT No.: PCT/US2016/025485
§ 371 (c)(1),
(2) Date: Jul. 31, 2018

(87) PCT Pub. No.: WO2017/171830
PCT Pub. Date: Oct. 5, 2017

(65) Prior Publication Data
US 2019/0051806 A1 Feb. 14, 2019

(51) Int. Cl.
*H01L 35/14* (2006.01)
*H10N 10/10* (2023.01)
*H10N 10/17* (2023.01)
*H10N 10/81* (2023.01)
*H10N 10/851* (2023.01)
(Continued)

(52) U.S. Cl.
CPC .......... *H10N 10/10* (2023.02); *H01L 29/785* (2013.01); *H10N 10/17* (2023.02); *H10N 10/81* (2023.02); *H10N 10/851* (2023.02); *H10N 19/00* (2023.02)

(58) Field of Classification Search
CPC .......... H01L 35/04; H01L 35/14; H01L 35/28
See application file for complete search history.

(56) References Cited

U.S. PATENT DOCUMENTS

| | | |
|---|---|---|
| 2006/0102223 A1 | 5/2006 | Chen et al. |
| 2007/0089773 A1 | 4/2007 | Koester et al. |

(Continued)

OTHER PUBLICATIONS

International Search Report dated Dec. 30, 2016 issued in corresponding International Application No. PCT/US2016/025485 [13 pages].

*Primary Examiner* — Anh D Mai
(74) *Attorney, Agent, or Firm* — Trop, Pruner & Hu, P.C.

(57) ABSTRACT

An apparatus includes a first semiconductor fin and a second semiconductor fin that is parallel to the first semiconductor fin. The first semiconductor fin extends from a first region of a substrate near a circuit that produces thermal energy when a circuit is in operation to a second region of the substrate, which is disposed away from the circuit. The second semiconductor fin extends from the first region to the second region and has a different material composition than the first semiconductor fin. The first and second semiconductor fins collectively exhibit a Seebeck effect when the circuit is in operation. The apparatus includes interconnects to couple the first and second semiconductor fins to a power supply circuit to transfer electricity generated due to the Seebeck effect to the power supply circuit.

3 Claims, 6 Drawing Sheets

(51) Int. Cl.
*H10N 19/00* (2023.01)
*H01L 29/78* (2006.01)

(56) References Cited

U.S. PATENT DOCUMENTS

| | | |
|---|---|---|
| 2008/0178921 A1 | 7/2008 | Ye |
| 2013/0139524 A1 | 6/2013 | Kim et al. |
| 2016/0027717 A1 | 1/2016 | Jiang et al. |
| 2017/0256696 A1* | 9/2017 | Colinge ................ H01L 35/325 |

* cited by examiner

HARVESTING ENERGY IN AN INTEGRATED CIRCUIT USING THE SEEBECK EFFECT

BACKGROUND

An ever-increasing number of electronic devices (mobile devices, such as smartphones, for example) are continually powered on. As such, manufacturers of the semiconductor components for these electronic devices may employ measures to reduce power consumption for purposes of extending battery life.

DETAILED DESCRIPTION

Reference will now be made to the drawings wherein like structures may be provided with like suffix reference designations. In order to show the structures of various implementations more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated implementations. Moreover, the drawings may only show the structures useful to understand the illustrated implementations. Additional structures known in the art may not have been included to maintain the clarity of the drawings. For example, not every layer of a semiconductor device is necessarily shown. "An implementation", "various implementations" and the like indicate implementation(s) so described may include particular features, structures, or characteristics, but not every implementation necessarily includes the particular features, structures, or characteristics. Some implementations may have some, all, or none of the features described for other implementations. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Some integrated circuit devices, such as three-dimensional (3-D) transistors, dissipate a significant amount of thermal energy during operation. As a more specific example, a fin-based field effect transistor (FinFET) is a 3-D transistor that is constructed around a relatively thin strip of semiconductor material (called a "fin"). As examples, the material for the fin may include one or more of the following: silicon, germanium, gallium arsenide, gallium nitride, or any semiconductor. Unlike a two-dimensional (2-D) planar transistor, in which the gate of the transistor overlies a planar conducting channel, in a FinFET, the drain and source are fabricated in a fin to form a vertical conducting channel. The gate of the FinFET surrounds the conducting channel on three sides. The thermal energy due to operation of the FinFET may be dissipated into the semiconductor package containing the FinFET.

A process to fabricate FinFETs in an integrated circuit may, in an intermediate state, create unused fins that are etched away. In accordance with example implementations, unused fins (e.g., remnants 106 and 107 of FIG. 1) that are produced by a FinFET fabrication process (e.g., a process to fabricate a transistor 104 of FIG. 1) may be retained (i.e., may not be etched away) and used for purposes of scavenging, or harvesting, thermal energy that is generated by operating circuit components (e.g., a circuit 108 that includes FinFETs, such as a FinFET 109 of FIG. 1) of the integrated circuit. More specifically, in accordance with example implementations that are described herein, these otherwise unused fins are used to take advantage of the Seebeck effect: the fins transform dissipated thermal energy into electrical energy, which may be transferred to the integrated circuit's power supply.

More particularly, in accordance with example implementations, semiconductor fins of an integrated circuit are arranged in pairs of parallel fins, with each pair being constructed to longitudinally extend in direction that is associated with a thermal gradient. The semiconductor fins are fabricated from materials having different compositions (n+ and p+ doped fins, for example), and due to the Seebeck effect, a thermal gradient along the pair of fins causes an electromotive force, or potential, to develop between the fins form an electrical current. This current may then be used to (as examples) either store electrical energy for circuitry of the integrated circuit and/or directly apply the energy to a power supply of the integrated circuit.

Figure 1:
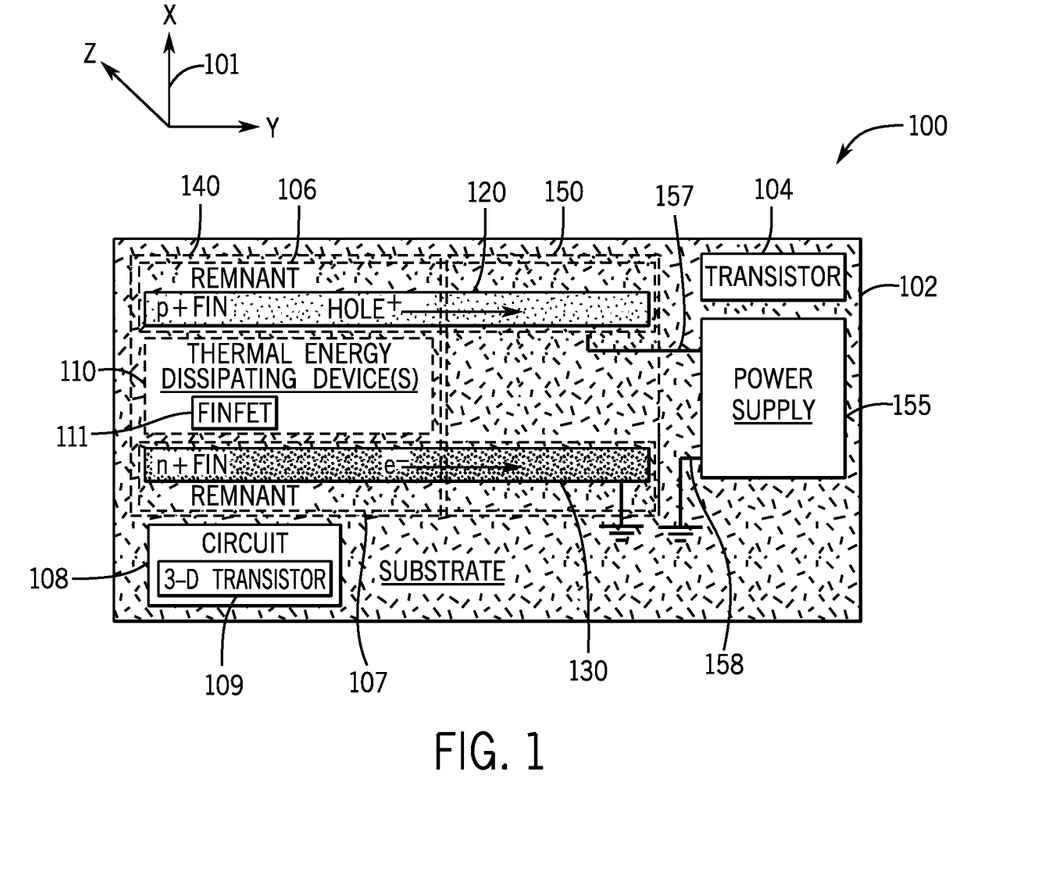
FIGS. 1, 3 and 4 are plan views of integrated circuit substrates depicting semiconductor fins to harvest thermal energy according to example implementations.

As a more specific example, FIG. 1 depicts an example plan view of an integrated circuit 100 in accordance with some implementations. The integrated circuit 100 includes an example pair of semiconductor Seebeck fins 120 and 130 (herein called the "semiconductor fin 120" and the "semiconductor fin 130," respectively). FIG. 1 also depicts orthogonal 3-D axes 101, where the z axis represents the depth axis extending through the different fabrication layers of the integrated circuit 100. As depicted in FIG. 1, the semiconductor fins 120 and 130 may be generally coplanar in the same x-y plane and are coplanar with the fabrication layers. In accordance with some implementations, the semiconductor fin 120 extends along the same directional x-y vector as the semiconductor fin 130, i.e., the fins 120 and 130 are parallel.

Figure 5:
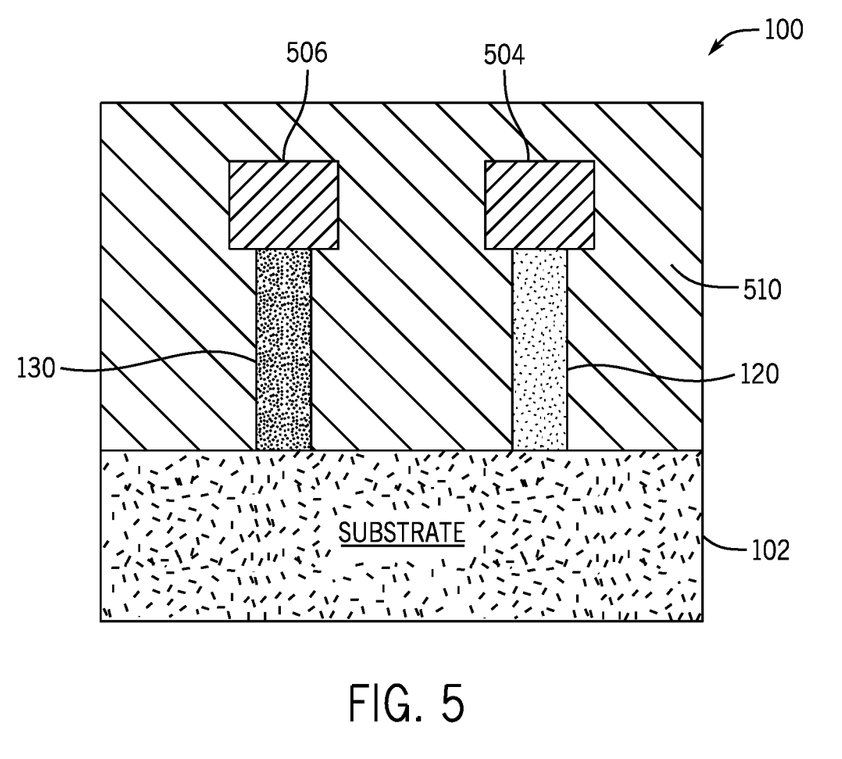
FIG. 5 is a cross-sectional view of the integrated circuit depicting interconnect connections according to an example implementation.

The semiconductor fins 120 and 130 are electrically coupled by interconnects (represented schematically in FIG. 1 by a positive voltage supply rail 157 (the $V_{CC}$ rail of the integrated circuit 100, for example) and ground 158) to a power supply 155. As an example, in accordance with some implementations, the interconnects may be metal interconnects that are formed in one or multiple metal layers of the integrated circuit 100. In this manner, referring to FIG. 5 in conjunction with FIG. 1, the semiconductor fin 120 may be electrically coupled to a metal interconnect 504 for electrically coupling the semiconductor fin 120 to the positive voltage supply rail 157; and the semiconductor fin 130 may be electrically coupled to a metal interconnect 506 to the integrated circuit's ground 158. In accordance with some implementations, the interconnects 504 and 506 may be copper, aluminum, tungsten, nickel, platinum, gold, silver or palladium. The interconnects coupling the semiconductor fins 120 and 130 to the power supply 155 may be fabricated from a material other than metal (a doped polysilicon or another conductive non-metal, as examples), in accordance with further example implementations. As depicted in FIG. 5, in accordance with example implementations, the semiconductor fin 120, the semiconductor fin 130, the interconnect 504 and the interconnect 506 may be surrounded by a dielectric layer 510. As examples, the dielectric material may be may be silicon oxide, silicon nitride, silicon oxynitride, fluorine doped silicon dioxide, carbon doped silicon dioxide or an organic polymer.

Referring back to FIG. 1, due to the Seebeck effect, the semiconductor fins 120 and 130 may develop a potential, or electromotive force, due to a thermal gradient along the longitudinal direction of the fins 120 and 130. This electromotive force, in turn, generates a current to communicate harvested, or scavenged, energy back to the power supply 155. In accordance with example implementations, the semiconductor fins 120 and 130 may be either silicon or germanium fins or may be constructed from any other materials that have relatively high Seebeck coefficients for purposes of enhancing the energy harvested by the fins 120 and 130.

As depicted in FIG. 1, the semiconductor fins 120 and 130 may be, in accordance with example implementations, doped such that the semiconductor fin 120 may be a p+ doped region and the semiconductor fin 130 may be an n+ doped region. As an example, the p-type dopant may include boron or indium. As examples, the n-type dopant may include phosphorus, arsenic or antimony.

As depicted in FIG. 1, the semiconductor fins 120 and 130 are placed in the vicinity of one or more thermal energy dissipating devices 110 (one or more FinFETs 111, for example). In other words, the semiconductor fins 120 and 130 are placed in the vicinity of circuitry that, when the circuitry operates, dissipates thermal energy. In general, the semiconductor fins 120 and 130 longitudinally extend in a direction (here, along the X axis 101), from a first region 140 associated with higher heat dissipation (a region relatively close to the thermal energy dissipating device(s) 110, for example) to a region 150 associated with less thermal dissipation. In other words, in accordance with example implementations, the semiconductor fins 120 and 130 longitudinally extend in a direction that coincides with a thermal gradient.

Moreover, as depicted in FIG. 1, in accordance with example implementations, the p+ doped semiconductor fin 120 may be coupled to the positive voltage supply rail 157 for the power supply 155, and the n+ doped semiconductor fin 130 may be electrically coupled to a negative supply voltage rail, which for the example implementation of FIG. 1, is ground 158. As such, the holes flow from the p+ doped semiconductor fin 120 and along the positive supply voltage rail 157 back to the power supply 155, and the electrons flow from the n+ doped semiconductor fin 130 to ground 158, thereby forming a current to transfer scavenged, or harvested, energy back to the power supply 155.

Thus, in accordance with example implementations, thermal energy dissipated from relatively high performance circuits may be used to supplement the power that is provided by voltage supply rails of the integrated circuit, thereby reducing the overall power that is consumed by circuitry of the integrated circuit 100 and hence, extending battery life (for applications in which the integrated circuit 100 is part of a mobile electronic device, for example). In accordance with further example implementations, the energy harvesting described herein may be used to trade off the supplemental power with performance and hence, achieve higher circuit performance at a matched battery life. Moreover, the energy harvesting described herein may also aid to reduce overheating of the integrated circuit or other nearby electronic devices, due to the dissipated thermal energy being transformed into electrical energy. Other and different advantages may be achieved in accordance with further implementations.

The Seebeck effect may be described by the following equation:

$$EMF = S\Delta T, \qquad \text{Eq. 1}$$

where "EMF" represents the electromotive force, or potential, between the pair of Seebeck semiconductor fins; "S" represents the Seebeck coefficient, which may be as much as 500 to 800 microvolts per degree Kelvin (K); and "$\Delta T$" represents the temperature difference, characterizing the temperature gradient. Hence, a temperature difference of 100 K may result in an EMF electromotive force of at least 50 mV.

In general, a current density J that is generated through the Seebeck effect may be described as follows:

$$J = \frac{EMF}{\rho L}, \qquad \text{Eq. 2}$$

where "$\rho$" represents the resistivity of the fin, which may be as low as one milliohm-centimeter (1 m$\Omega$-cm); and "L" represents the length of the fin.

Assuming that the L length of the semiconductor fin is 100 micrometers ($\mu$m) and the cross-sectional dimension of the fin is 10 nanometers (nm)×50 nm, eight thousand (as an example) pairs of the fins may approximately occupy 800 $\mu$m×100 $\mu$m of substrate area, depending on the pitch of the fin (a 50 nm fin pitch being used for this example).

In accordance with example implementations, all or some of the semiconductor fin pairs may be disposed in dedicated, extra regions of the integrated circuit. However, in accordance with further example implementations, the regions of the integrated circuit surrounding area of high performance circuit blocks may be otherwise empty or unused because of reliability requirements; and these areas may be selectively, heavily doped to form corresponding Seebeck semiconductor fins.

Figure 2:
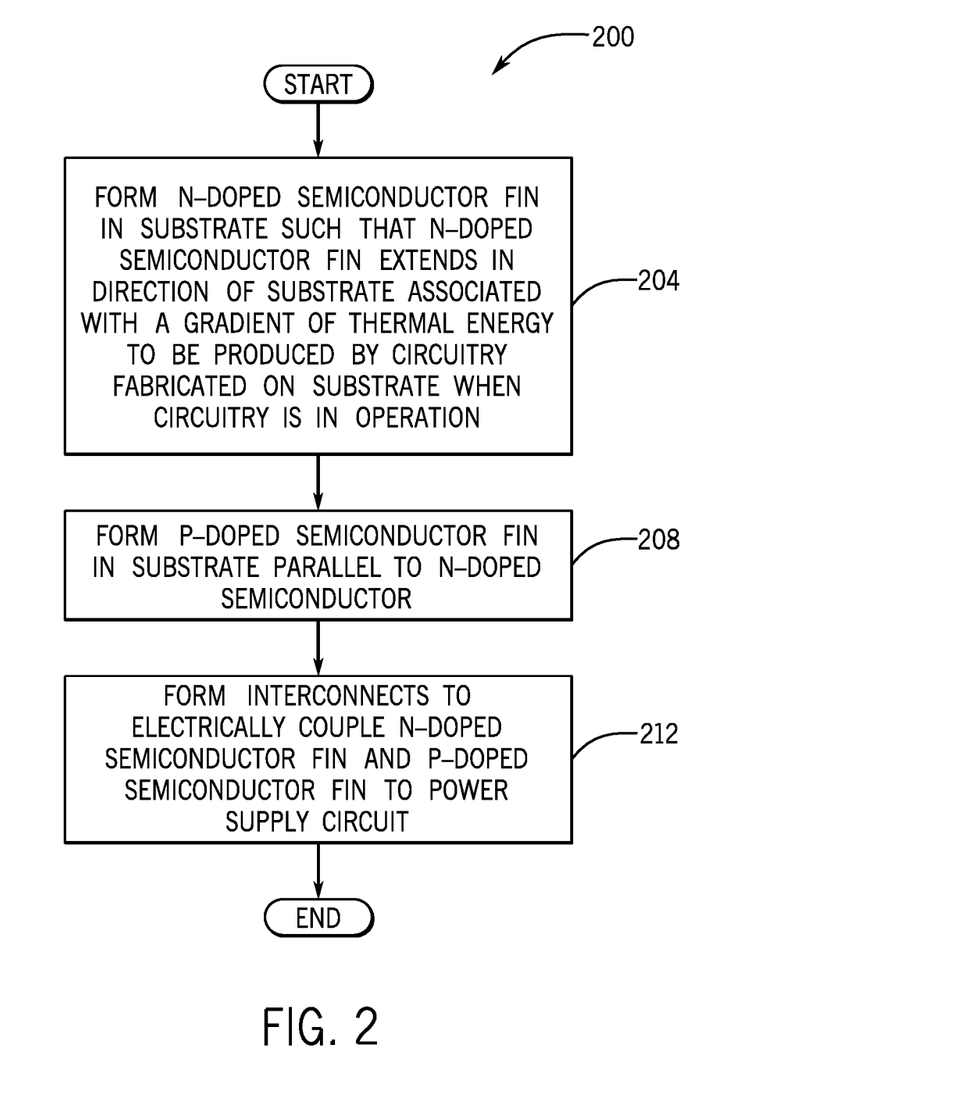
FIG. 2 is a flow diagram depicting an integrated circuit fabrication process according to an example implementation.

Thus, referring to FIG. 2, in accordance with example implementations, a process 200 may be used to fabricate an integrated circuit. Pursuant to the process 200, an n-doped semiconductor fin is formed in a substrate of the integrated circuit, pursuant to block 204. The n-doped semiconductor fin extends in a direction of the substrate, which is associated with a thermal energy gradient to be produced by circuitry (fabricated on the substrate) when the circuitry is in operation. Pursuant to block 208, a p-doped semiconductor fin is formed in the substrate, which is parallel to the n-doped semiconductor fin. The process 200 includes forming (block 212) interconnects to electrically couple the n-doped and p-doped semiconductor fins of the pair to a power supply circuit. The power supply circuit may or may not be fabricated in the integrated circuit, depending on the particular implementation.

It is noted that blocks 204, 208 and 212 may be performed or completed in any order, depending on the particular implementation. Moreover, the blocks may not be performed sequentially, but rather some of the blocks (blocks 204 and 208 in which the fins are formed, for example) may be performed, to some degree, in parallel. In an example implementation, the n-doped semiconductor fin may be completed before completion of the p-doped semiconductor fin (i.e., n-doping may be performed before p-doping, in accordance with some implementations), followed by fabrication of the interconnects.

Other implementations are contemplated, which are within the scope of the appended claims. For example, although FIG. 1 depicts the semiconductor fins 120 and 130 as being directly connected to the rails of the power supply 155, the semiconductor fins 120 and 130 may be electrically coupled to a temporary storage device so that harvested energy may be temporarily stored before being transferred to the power supply 155. For example, referring to FIG. 3, in accordance with further example implementations, an integrated circuit 300 has a design similar to the integrated circuit 100 FIG. 1, with similar reference numerals being used to denote similar elements. Unlike the integrated circuit 100, the integrated circuit 300 includes a capacitor 360 (schematically depicted in FIG. 3), which has one terminal that is directly connected to the semiconductor fin 120 (using an interconnect, for example); and another terminal of the capacitor may be directly connected to the semiconductor fin 130 (using another interconnect, for example). As a more specific example, in accordance with some implementations, the capacitor 360 may be a metal finger capacitor, although other capacitors may be used, in accordance with further example implementations.

Figure 3:
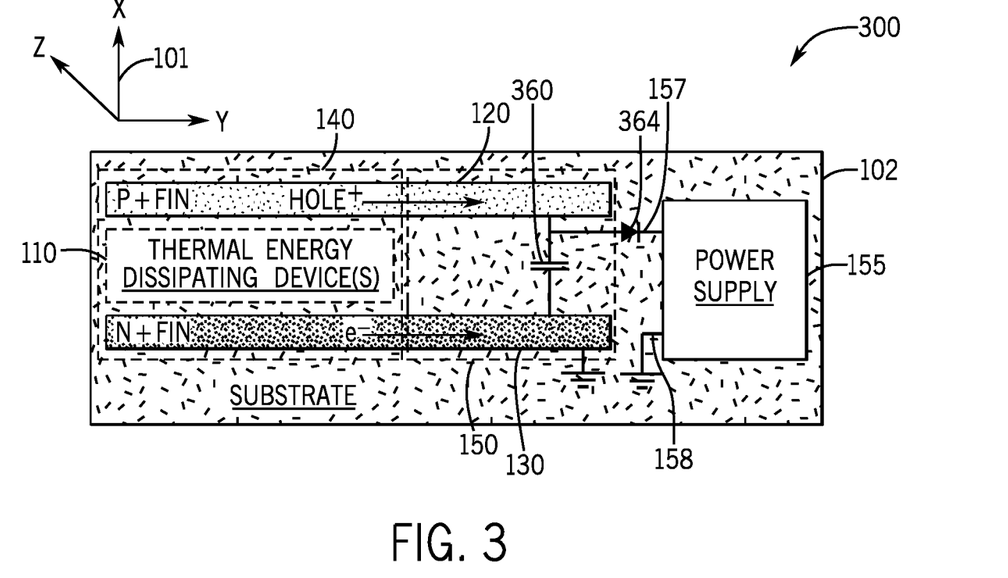

As also depicted in FIG. 3, a rectifier, or diode 364 (schematically depicted in FIG. 3), may be electrically coupled between the capacitor 360 and the power supply 155 to regulate when stored, harvested energy is transferred to the power supply 155. In this manner, as depicted in FIG. 3, the anode of the diode 364 may be directly connected to the semiconductor fin 120 (using an interconnect, for example), and the cathode of the diode 364 may be coupled to the positive supply voltage rail 157 for the power supply circuit 155. Due to this arrangement, the circuitry of FIG. 3 may operate as follows. Assuming that the capacitor 360 has an initial low charge, charge accumulates in the capacitor 360 due to the current from the semiconductor fins 120 and 130 transferring charge to the capacitor 360. The diode 364 remains off, or does not conduct, until a sufficient charge accumulates in the capacitor 360 to raise the capacitor's terminal voltage to turn on the diode 364. When the diode 364 turns on, a current path is created to discharge the capacitor 360 to transfer the stored, harvested energy to the power supply 155.

Figure 4:
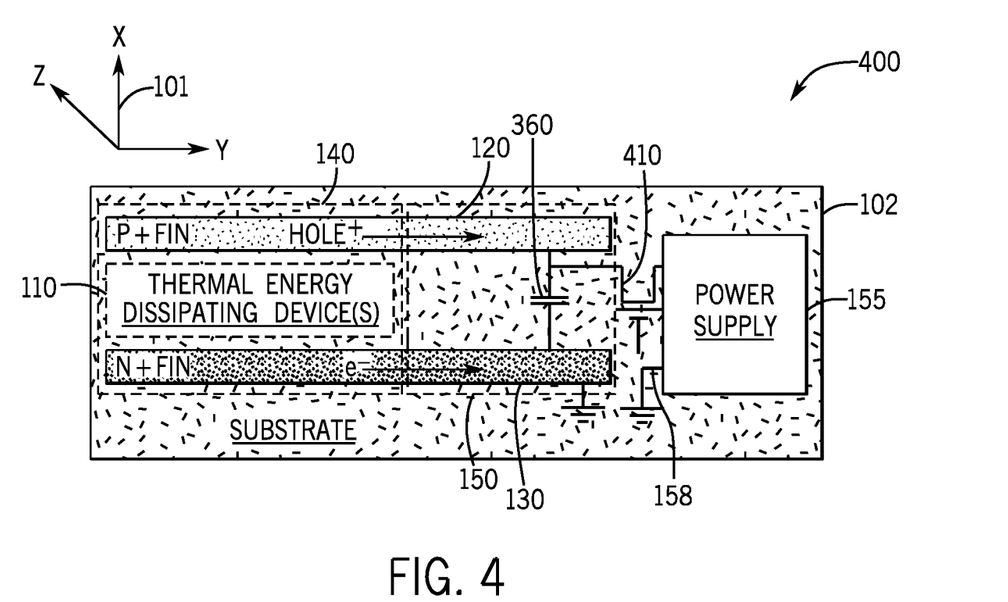

Referring to FIG. 4, in accordance with a further example implementation, an integrated circuit 400 may have the same features to the integrated circuit 300, with similar reference numerals being used to denote similar elements. However, unlike the integrated circuit 300, the integrated circuit 400 includes a field effect transistor (FET) 410, which replaces the diode 364. In this manner, in accordance an example implementation, the FET may be a p-channel device, the source of the FET 410 may be coupled to the semiconductor fin 120, and the drain of the FET 410 may be coupled to the positive supply voltage rail 157. In this manner, a voltage may be applied to the gate of the FET 410 for purposes of selectively creating a conductive path through the FET's controlled current path for purposes of transferring the harvested energy from the capacitor 360 to the power supply 155. As an example, the power supply 155 or another circuit may periodically turn on the FET 410, in accordance with some implementations, to transfer the stored, harvested charge to the power supply 155.

Although an example pair of Seebeck semiconductor fins 120 and 130 is described herein, in accordance with example implementations, an integrated circuit may contain multiple pairs (thousands of pairs, for example) of fins. The pairs may be fabricated in different layers and have multiple orientations, in accordance with example implementations.

Figure 6:
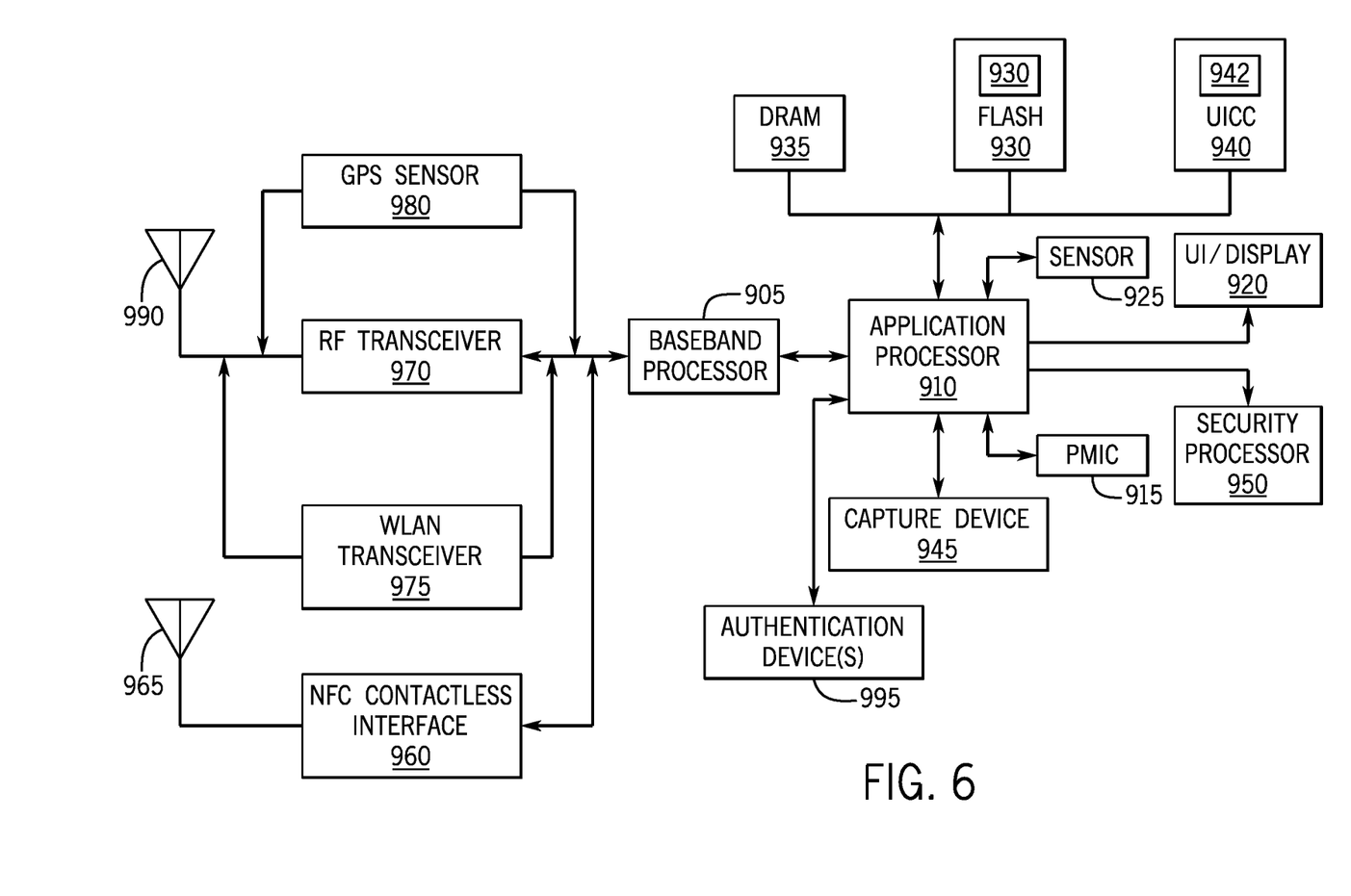
FIGS. 6 and 7 are schematic diagrams of systems according to example implementations.

Referring now to FIG. 6, in accordance with example implementations, a system 900 may include integrated circuits, which contain Seebeck semiconductor fins, as described herein. The system 900, may be, as examples, a smartphone, a wireless communicator, or any other IoT device. A baseband processor 905 is configured to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some implementations, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some implementations includes a secure storage 942 to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 7:
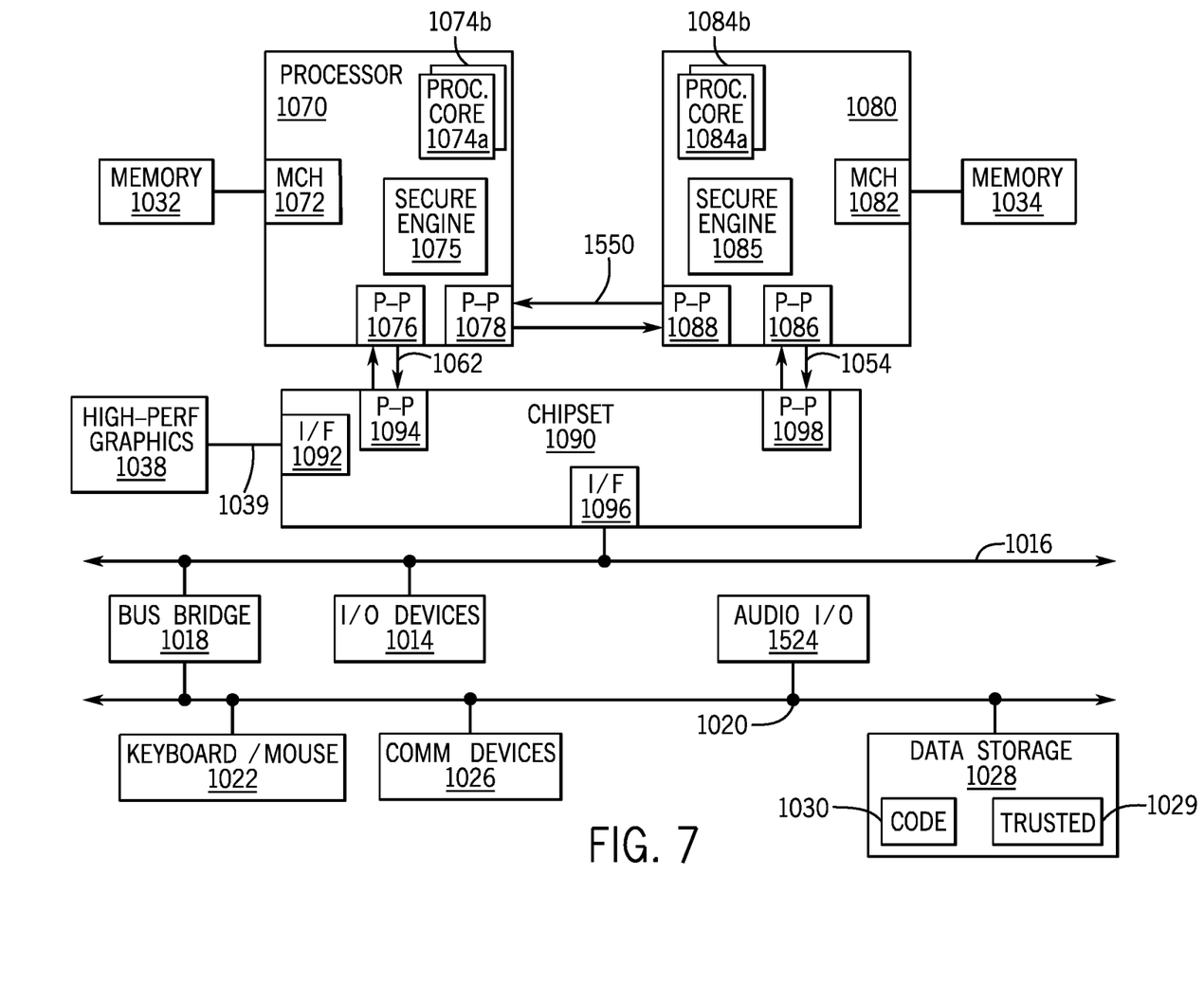

Referring to FIG. 7, in accordance with further example implementations, a multiprocessor system 1000, such as a point-to-point interconnect system (a server system, for example) may include a first processor 1070 and a second processor 1080 coupled via a point-to-point interconnect 1050. Each of processors 1070 and 1080 may be multicore processors such as SoCs, including first and second processor cores (i.e., processor cores 1074*a* and 1074*b* and processor cores 1084*a* and 1084*b*), although potentially many more cores may be present in the processors. In addition, processors 1070 and 1080 each may include a secure engine 1075 and 1085 to perform security operations such as attestations, IoT network onboarding or so forth.

In accordance with example implementations, the processor 910, the processor 1070, the memory 935, the memory 932, the memory 1032, the memory 1034, and the memory 1028 are a few examples of integrated circuits that may contain Seebeck fins.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1052 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one implementation. As further seen, data storage unit 1028 also includes a trusted storage 1029 to store sensitive information to be protected. Further, an audio I/O 1024 may be coupled to second bus 1020.

Other implementations are contemplated and are within the scope of the appended claims. For example, in some implementations, a communication device may be arranged to perform the various and techniques described herein. In accordance with further example implementations, a device other than a communication device may be arranged to perform the various methods and techniques described herein.

Implementations may be used in many different types of systems. For example, in one implementation a communication device can be arranged to perform the various methods and techniques described herein. Of course, the scope of the present invention is not limited to a communication device, and instead other implementations can be directed to other types of apparatus for processing instructions, or one or more machine readable media including instructions that in response to being executed on a computing device, cause the device to carry out one or more of the methods and techniques described herein.

In accordance with example implementations, the process of FIG. 2 may be implemented by executing machine executable instructions, or "program code," which is stored on non-transitory media. In this manner, the program code, when executed by one or multiple central processing unit(s), (one or multiple processing cores, and so forth) may cause the processor to fabricate at least one integrated circuit to perform one or multiple operations. Implementations (e.g., code for implementing the process of FIG. 2) may be implemented in code and may be stored on a non-transitory storage medium having stored thereon instructions which can be used to program a system to perform the instructions. Implementations also may be implemented in data and may be stored on a non-transitory storage medium, which if used by at least one machine, causes the at least one machine to fabricate at least one integrated circuit to perform one or more operations. As examples, the storage media may include semiconductor storage devices, magnetic storage devices, optical storage devices, and so forth. As more specific examples, the storage media may include floppy disks, optical disks, solid state drives (SSDs), compact disk read-only memories (CD-ROMs), compact disk rewritable (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following examples pertain to further implementations.

Example 1 includes an apparatus that includes a first semiconductor fin extending from a first region of a substrate near a circuit that produces thermal energy when the circuit is in operation to a second region of the substrate away from the circuit; a second semiconductor fin parallel to the first semiconductor fin, extending from the first region to the second region and having a different material composition relative to the first semiconductor fin. The first and second semiconductor fins collectively exhibit a Seebeck effect when the circuit is in operation. The apparatus includes interconnects to couple the first and second semiconductor fins to a power supply circuit to transfer electricity generated due to the Seebeck effect to the power supply circuit.

In Example 2, the subject matter of Example 1 may optionally include the first semiconductor fin including an n+-doped region, and the second semiconductor fin including a p+-doped region.

In Example 3, the subject matter of Examples 1-2 may optionally include the power supply circuit being fabricated in the substrate.

In Example 4, the subject matter of Examples 1-3 may optionally include the circuit that dissipate thermal energy when in operation including a three-dimensional (3-D) transistor.

In Example 5, the subject matter of Examples 1-4 may optionally include the circuit that dissipate thermal energy when in operation being electrically isolated from the first and second semiconductor fins.

In Example 6, the subject matter of Examples 1-5 may optionally include the first and second semiconductor fins being generally coplanar.

In Example 7, the subject matter of Examples 1-6 may optionally include the interconnects directly coupling the second semiconductor to a supply rail associated with the power supply circuit and a ground associated with the power supply circuit.

In Example 8, the subject matter of Examples 1-7 may optionally include a capacitor that is formed in the substrate and is electrically coupled to the first and second semiconductor fins.

In Example 9, the subject matter of Examples 1-8 may optionally include a diode that is formed in the substrate and electrically coupled between the capacitor and a power supply rail of the power supply circuit.

In Example 10, the subject matter of Examples 1-9 may optionally include a transistor that is formed in the substrate and includes a controlled current path electrically coupled between the capacitor and a power supply rail of the power supply circuit.

In Example 11, the subject matter of Examples 1-10 may optionally include the first and second semiconductor fins not being part of a transistor.

In Example 12, the subject matter of Examples 1-11 may optionally include the first semiconductor fin including a p+ doped region and the second semiconductor fin including an n+ doped region.

Example 13 includes a system that includes a memory; and a processor coupled to the memory. At least one of the processor and the memory includes an apparatus according to any one of Examples 1 to 12.

Example 14 includes a method that includes forming an n-doped semiconductor fin in a substrate, where the n-doped semiconductor fin extends in a direction of the substrate associated with a thermal gradient due to power dissipation of a first circuit when in operation; forming a p-doped semiconductor fin the substrate parallel to the n-doped semiconductor; and forming interconnects to couple the n-doped semiconductor fin and the p-doped semiconductor fin to a power supply circuit.

In Example 15, the subject matter of Example 14 may optionally include forming a capacitor directly connected to the interconnects.

In Example 16, subject matter of Examples 14-15 may optionally include forming a metal finger capacitor.

In Example 17, the subject matter of Examples 14-16 may optionally include a first interconnect of the interconnects being connected to the p-doped semiconductor fin, a second interconnect of the interconnects being connected to a positive supply rail, and the method further including forming a diode having an anode directly connected to the first interconnect and a cathode directly connected to the second interconnect.

In Example 18, the subject matter of Examples 14-17 may optionally include a first interconnect of the interconnects being connected to the p-doped semiconductor fin, a second interconnect of the interconnects being connected to a positive supply rail, and the method further including forming a field effect transistor having a drain directly connected to the first interconnect and a source directly connected to the second interconnect.

Example 19 includes an apparatus that includes a substrate; a power supply circuit to provide power; a device formed in the substrate to produce thermal energy in response to the power provided by the power supply circuit when the device is in operation; an n+ doped semiconductor fin extending from a first region of the substrate near the device circuit to a second region of the substrate away from the device; a p+ doped semiconductor fin parallel to the n+ doped semiconductor fin, extending from the first region to the second region, where the n+ doped semiconductor fin and the p+ doped semiconductor fin collectively exhibit a Seebeck effect when the device is in operation to provide a current in response to the thermal energy produced by the device when the device is in operation; and interconnects to communicate the current to the power supply circuit.

In Example 20, the subject matter of Example 19 may optionally include the device including a three-dimensional transistor fabricated in the substrate.

In Example 21, the subject matter of Example 19 may optionally include the power supply circuit being fabricated in the substrate.

The foregoing description of the implementations of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The implementations of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. An apparatus comprising:
    a transistor;
    a plurality of semiconductor fins,
    wherein:
        the plurality of semiconductor fins comprise a first semiconductor fin and a second semiconductor fin,
        the first semiconductor fin and the second semiconductor fin correspond to remnants of a process to fabricate the transistor and are not part of the transistor,
        the first semiconductor fin extends from a first region of a substrate near a first circuit that produces thermal energy when the first circuit is in operation to a second region of the substrate away from the first circuit,
        the second semiconductor fin is parallel to the first semiconductor fin, the second semiconductor fin extends from the first region to the second region and has a different material composition relative to the first semiconductor fin, and the first and second semiconductor fins collectively exhibit a Seebeck effect when the first circuit is in operation;

interconnects to couple the first and second semiconductor fins to a power supply circuit to transfer electricity generated due to the Seebeck effect to the power supply circuit; and a metal finger capacitor formed in the substrate and electrically coupled to the first and second semiconductor fins.

2. The apparatus of claim 1, further comprising a diode formed in the substrate and electrically coupled between the capacitor and a power supply rail of the power supply circuit.

3. The apparatus of claim 1, further comprising a transistor formed in the substrate and comprising a controlled current path electrically coupled between the capacitor and a power supply rail of the power supply circuit.

* * * * *